(12) United States Patent
Bickerstaff

(10) Patent No.: US 6,851,039 B2
(45) Date of Patent: Feb. 1, 2005

(54) METHOD AND APPARATUS FOR GENERATING AN INTERLEAVED ADDRESS

(75) Inventor: Mark Andrew Bickerstaff, Carlingford (AU)

(73) Assignee: Lucent Technologies Inc., Murray Hill, NJ (US)

( * ) Notice: Subject to any disclaimer, the term of this patent is extended or adjusted under 35 U.S.C. 154(b) by 242 days.

(21) Appl. No.: 10/259,600

(22) Filed: Sep. 30, 2002

(65) Prior Publication Data

US 2004/0064666 A1 Apr. 1, 2004

(51) Int. Cl.$^7$ ............................................... G06F 12/00
(52) U.S. Cl. ......................... 711/219; 711/1; 711/100; 711/220; 711/221
(58) Field of Search ................................ 711/147, 152, 711/154, 149, 151, 100, 200, 202, 216, 219, 220, 221; 709/213, 214, 215, 216, 217

(56) References Cited

U.S. PATENT DOCUMENTS

| | | | | |
|---|---|---|---|---|
| 5,659,580 A | * | 8/1997 | Partyka | 375/295 |
| 5,982,294 A | * | 11/1999 | Takayama et al. | 340/7.44 |
| 2002/0119803 A1 | * | 8/2002 | Bitterlich et al. | 455/552 |

FOREIGN PATENT DOCUMENTS

FR    2755266    4/1998

OTHER PUBLICATIONS

Daneshgaran, et al., "Permutation FIxed Points with Application to Estimation of Minimum Distance of Turbo Codes", © 2000 IEEE, p. 2336–2349.*

Shibutani, et al., "Performance of W–CDMA Mobile Radio with Turbo Codes Using Prime Interleaver", © 2000 IEEE, p. 946–950.*

Crozier, et al., "High–Performance Low–Memory Interleaver Banks ofr Turbo–Codes", © 2001 IEEE, p. 2394–2398.*

Sivakumar, R. et al. "VLSI Architectures for Computing X mod M," *IEEE Proceedings on Circuits, Devices and Systems*, vol. 142, No. 5, Oct. 1995, pp. 313–320.

Heergard, C. et al. "Interleaving." Kluwer Academic Publishers, 1999, pp. 35–63.

Berrou, Claude et al. "Near Optimum Error Correcting Coding and Decoding: Turbo–Codes." *IEEE Transactions on Communications*, vol. 40, No. 10, Oct. 1996, pp. 1261–1271.

Wu, Z. "Coding and Iterative Detection for Magnetic Recording Channels." Kluwer Academic Publishers, 1999, pp. 44–45.

Erfanian, Javan et al. "Reduced Complexity Symbol Detectors with Parallel Structures for ISI Channels." *IEEE Transaction on Communications*. vol. 42, Feb./Mar./Apr. 1994, pp. 1661–1671.

(List continued on next page.)

*Primary Examiner*—Donald Sparks
*Assistant Examiner*—Brian R. Peugh

(57) ABSTRACT

In the method of generating an interleaved address, each $2^i$ mod (p–1) value for i=0 to x–1 is stored. Here, p is a prime number dependent on a block size K of a data block being processed and x is greater than one. An inter-row sequence number is multiplied with a column index number to obtain a binary product. Both the inter-row sequence number and the column index number are for the block size K and the prime number p. Then, each binary component of the binary product is multiplied with a respective one of the stored $2^i$ mod (p–1) values to obtain a plurality of intermediate mod value. An intra-row permutation address is generated based on the plurality of intermediate mod values, and an interleaved address is generated based on the intra-row permutation address.

22 Claims, 4 Drawing Sheets

OTHER PUBLICATIONS

Summers, Todd et al. "SNR Mismatch and Online Estimation in Turbo Decoding," *IEEE Transactions on Communications*, vol. 41, 1998, pp. 421–423.

Pietrobon, Steven S. "Implementation and Performance Of A Turbo/Map Decoder." *International Journal of Satellite Communications*. 16, 1998, pp. 23–46.

Robertson, Patrick et al. "Optimal and Sub–Optimal Maximum a Posteriori Algorithms Suitable for Turbo Decoding." International Conference on Communications, 1995, pp. 119–125.

Bahl, L.R. et al. "Optimal Decoding of Linear Codes for Minimizing Symbol Error Rate." *IEEE Trans. Inform. Theory*, vol. IT–20, Mar. 1974, pp. 284–287.

Robertson, Patrick et al. "A Comparison of Optimal and Sub–Optimal MAP Decoding Algorithms Operating in the Log Domain." IEEE 1995, pp. 1009–1013.

Worm, Alexander. "Turbo–Decoding Without SNR Estimation." IEEE Communications Letter, vol. 4, No. 6, Jun. 2000, pp. 193–195.

"$3^{rd}$ Generation Partnership Project (3GPP); Technical Specification Group Radio Access Network Multiplexing and Channel Coding (FDD) (3G TS 25.212 version 3.0.0)". Oct. 1999.

Nortel Networks. "Comparison of Turbo Interleavers for 3GPP". TSG–RAN Working Group Meeting #2, Feb. 22, 1999, pp. 1–9.

European Search Report, Feb. 24, 2004.

\* cited by examiner

METHOD AND APPARATUS FOR GENERATING AN INTERLEAVED ADDRESS

BACKGROUND OF THE INVENTION

1. Field of the Invention

The present invention relates to the field of turbo coding, and more particularly, address interleaving in the turbo coding process.

2. Description of Related Art

Turbo coding is one of the most important components for data transmission in the third generation (3G) wireless standards such as the Universal mobile telephone standard (UMTS). Turbo coding provides forward error correction with exception coding gain, and provides for almost error-free data transmissions for all but the lowest signal-to-noise ratio (SNR) environments. The key component of the turbo coding structure is the interleaver which permutes the data sequence between the two constituent decoders. Research has shown that the overall performance of turbo codes are directly related to the "randomness" of the interleaver between the blocks.

The 3GPP standard defines the interleaver for turbo codes as a function based on the block sizes in the range of 40 to 5114 bits. The 3GPP interleaver uses a basic block interleaver structure with a complex inter-row and intra-row permutation to generate a pseudo-random interleaving pattern. While these permutations provide excellent algorithmic performance, they severely complicate the hardware implementation of the interleaver.

One possible architecture for a hardware address interleaver is to use a large memory which contains the entire address interleaving sequence. Thus the turbo components simply access the memory to retrieve the next interleaved address. This is the most straightforward implementation, but the entire table must be recalculated when the block size changes. While the overhead in loading the table may be acceptable for a mobile terminal, infrastructure turbo decoders may need to deal with multiple block sizes, one right after another.

SUMMARY OF THE INVENTION

The present invention provides an alternative to using a large memory based hardware address interleaver in a turbo decoder. In the methodology of generating an interleaved address according to the present invention, some of the guiding tables from the interleaver algorithm are used, but the interleaved addresses are generated on the fly. An impediment to generating interleaved addresses on the fly is the significant computation power and circuit area usually required to perform a mod operation, which forms part of the interleaved address generation process. According to the method of generating an interleaved address of the present invention, the computation power and circuit area for performing the mod operation have been reduced.

In the method of generating an interleaved address, each $2^i \mod (p-1)$ value for $i=0$ to $x-1$ is stored. Here, p is a prime number dependent on a block size K of a data block being processed and x is greater than one. An inter-row sequence number is multiplied with a column index number to obtain a binary product. Both the inter-row sequence number and the column index number are for the block size K and the prime number p. Then, each binary component of the binary product is multiplied with a respective one of the stored $2^i \mod (p-1)$ values to obtain a plurality of intermediate mod values. An intra-row permutation address is generated based on the plurality of intermediate mod values, and an interleaved address is generated based on the intra-row permutation address.

In one embodiment, the mod computation device includes a memory storing the $2^i \mod (p-1)$ values. A first multiplier multiplies the inter-row sequence number with the column index number to obtain a binary product. A second multiplier multiplies each binary component of the binary product with a respective one of the stored $2^i \mod (p-1)$ values to obtain the plurality of intermediate mod values, and a mod summation block performs a mod summation operation on the plurality of intermediate mod values to generate the intra-row permutation address. The mod summation block has a tree lattice of modulo adders. Each modulo adder sums inputs to the modulo adder and generates mod (p-1) values of the sum.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EMBODIMENTS

Figure 1:
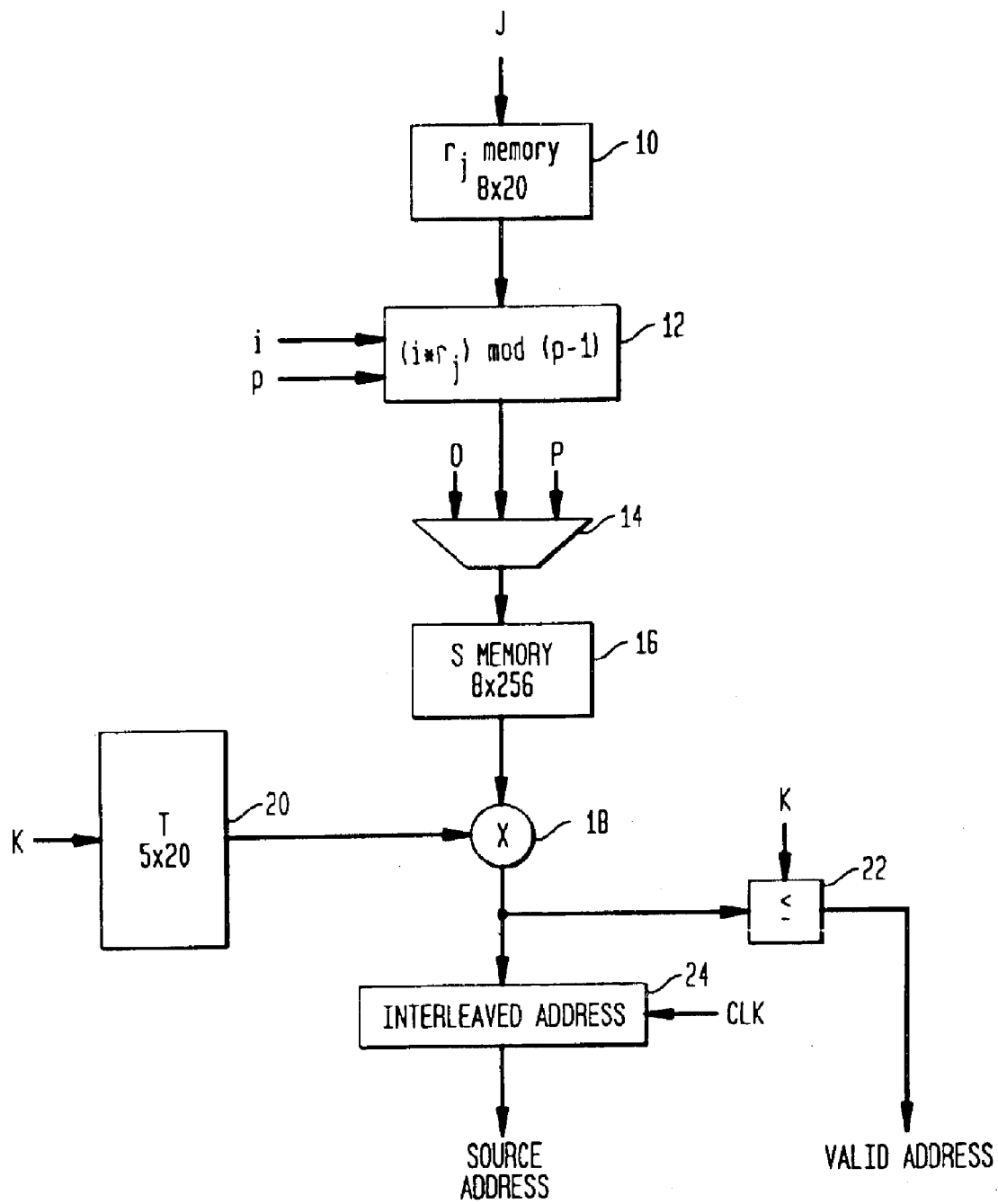
FIG. 1 shows an overall architecture for the address interleaver structure.

Initially, the general methodology of generating an interleaved address will be described followed by a description of the general architecture for generating the interleaved address. Next, a description of the methodology for generating an interleaved address according to the present invention will be described. Further, an embodiment for implementing the methodology according to the present invention will be described. Lastly, another architecture for generating the interleaved address in which the present invention may be employed will be described.

General Methodology for Generating an Interleaved Address

A method for producing an interleaved address may include several steps. An exemplary method includes the steps of formatting the input data bits into a rectangular matrix, performing intra-row and inter-row permutations on the rectangular matrix, and outputting the bits from the rectangular matrix with pruning.

The first step is to format the input bits into a rectangular matrix. If K is the number of inputs bits in the data block to encode (i.e., the block size), the first item that needs to be found is the number of rows, R, in the basic block interleaver structure. Equation (1) demonstrates the selection process for R, wherein one of three values, 5, 10 or 20 is selected.

$$R = \begin{cases} 5, & K \in [40, 159] \\ 10, & K \in [160, 200] \cup [481, 530] \\ 20, & K \in [201, 480] \cup [531, 5114] \end{cases} \quad (1)$$

The number of columns in the block interleaver is determined by calculating the minimum prime number that can solve equation (2).

$$p = \begin{cases} 53, & K \in [481, 530] \\ \min p \therefore (p+1) - \dfrac{K}{R} \geq 0, & \text{others} \end{cases} \quad (2)$$

Then, the number of columns in the table can be computed based on the prime number as seen in equation (3).

$$C = \begin{cases} p-1, & \left(p - \dfrac{K}{R} \geq 0\right) \text{ and } \left(p - 1 - \dfrac{K}{R} \geq 0\right) \\ p, & \left(p - \dfrac{K}{R} \geq 0\right) \text{ and } \left(p - 1 - \dfrac{K}{R} < 0\right) \\ p+1, & \text{others} \end{cases} \quad (3)$$

Once these three variables are known, R, p and C, the data can be written into a block interleaver table in sequential order, row by row. Note that the last row written may only be partially filled, so the rest of the row is loaded with zeroes.

The next step is to compute the intra-row sequence. To do this, the primitive root associated with the precalculated value of p is selected from Table 1 below based on the value of p.

TABLE 1

Prime numbers p and the associated primitive root v

| p | v | p | v | p | v | p | v | p | v |
|---|---|---|---|---|---|---|---|---|---|
| 7 | 3 | 4 | 5 | 10 | 2 | 15 | 5 | 22 | 3 |
| 11 | 2 | 5 | 2 | 10 | 5 | 16 | 2 | 22 | 2 |
| 13 | 2 | 5 | 2 | 10 | 2 | 16 | 5 | 22 | 6 |
| 17 | 3 | 6 | 2 | 10 | 6 | 17 | 2 | 23 | 3 |
| 19 | 2 | 6 | 2 | 11 | 3 | 17 | 2 | 23 | 7 |
| 23 | 5 | 7 | 7 | 12 | 3 | 18 | 2 | 24 | 7 |
| 29 | 2 | 7 | 5 | 13 | 2 | 19 | 19 | 25 | 6 |
| 31 | 3 | 7 | 3 | 13 | 3 | 19 | 5 | 25 | 3 |
| 37 | 2 | 8 | 2 | 13 | 2 | 19 | 2 | | |
| 41 | 6 | 8 | 3 | 14 | 2 | 19 | 3 | | |
| 43 | 3 | 9 | 5 | 15 | 6 | 21 | 2 | | |

The values of p and v serve to generate the intra-row permutation sequence s(i).

$$s(i) = [v \times s(i-1)] \bmod p, i=1,2, \ldots, (p-2), s(0) = 1 \quad (4)$$

Let $q_0$ be the $1^{st}$ prime integer in the sequence $\{q_j\}$. $\{q_j\}$ is generated as follows:

$$\text{g.c.d.} \{q_j, p-1\} = 1, q_j > 6_1, q_j > q_{(j-1)}, \text{ where g.c.d. is the greatest common denominator} \quad (5)$$

$\{q_j\}$ is permuted to the inter-row sequence $\{r_j\}$ such that $$r_{T(j)} = q_j, j=0,1, \ldots, R-1, \quad (6)$$

where T(j) (j=0,1,2, . . . , R−1) is the inter-row permutation pattern defined by one of the four sequences

| Pat$_1$ | 19, 9, 14, 4, 0, 2, 5, 7, 12 18, 10, 8, 13, 17, 3, 1, 16, 6, 15, |
| Pat$_2$ | 19, 9, 14, 4, 0, 2, 5, 7, 12, 18, 16, 13, 17, 15, 3, 1, 6, 11, |
| Pat$_3$ | 9, 8, 7, 6, 5, 4, 3, 2, 1, 0 |
| Pat$_4$ | 4, 3, 2, 1, 0 | where these patterns are selected as follows based upon the current block size $$\{T(0), T(1), T(2), \ldots, T(R-1)\} = \begin{cases} Pat_4 & \text{if } (40 \leq K \leq 159) \\ Pat_3 & \text{if } (160 \leq K \leq 200) \\ Pat_1 & \text{if } (201 \leq K \leq 480) \\ Pat_3 & \text{if } (481 \leq K \leq 530) \\ Pat_1 & \text{if } (531 \leq K \leq 2280) \\ Pat_2 & \text{if } (2281 \leq K \leq 2480) \\ Pat_1 & \text{if } (2481 \leq K \leq 3160) \\ Pat_2 & \text{if } (3161 \leq K \leq 3210) \\ Pat_1 & \text{if } (3211 \leq K \leq 5114) \end{cases}$$

Intra-row permutations are performed as follows:
if (C=p) then $$U_j(i) = s([i \times r_j] \bmod (p-1)), i=0,1,2, \ldots, (p-2), U_j(p-1)=0,$$

where $U_j(i)$ is the input bit position of the i-th output after the permutation of the j-th row.
end if
if (C=p+1) then $$U_j(i) = s([i \times r_j] \bmod (p-1)), i=0,1,2, \ldots, (p-2), U_j(p-1)=0 \text{ and } U_j(p)=p,$$

where $U_j(i)$ is the input bit position of the i-th output after the permutation of the j-th row.
end if
if (C=p−1) then $$U_j(i) = s([i \times r_j] \bmod (p-1)), i=0,1,2, \ldots, (p-2).$$

where $U_j(i)$ is the input bit position of the i-th output after the permutation of the j-th row.
end if
The inter-row permutation based upon the pattern T(j) (j=0,1,2, . . . , R−1) is performed, where T(j) is the original row position of the j-th permuted row.

The final step concerns the pruning of addresses that resulted from the partially filled row mentioned previously. If the generated address is larger than the current block length then the generated address is discarded.

General Architecture for Generating an Interleaved Address

FIG. 1 shows an overall architecture for the address interleaver structure. The other components forming the turbo decoder have not been show for the sake of clarity, and are well-known in the art. Accordingly, it will be appreciated, particularly from the description of the general methodology above and the following description, that the generation of the various inputs to this overall architecture are well-known. The architecture is partitioned into several sections, and follows closely from the 3GPP algorithm.

As shown, a first look-up table 10 stores the inter-row sequence numbers, and outputs one of the inter-row sequence numbers using a received row index j as an address. A mod computation device 12 generates an intra-row permutation address by computing (i*$r_j$) mod (p−1).

The intra-row permutation address, zero and p are supplied to a selector 14. The selector 14 normally outputs the intra-row permutation address, but when the number of rows and columns equals the block size, the first and last column are swapped by the selector 14 when the last row is being processed to maintain relative ordering of the number patterns from block size to block size.

A second look-up table 16 stores the intra-row permutation sequences S (see equation 4), and outputs one of the intra-row permutation sequences using the output from the selector 14 as an address. A multiplier 18 receives the intra-row permutation sequence from the second look-up table 16 and an inter-row permutation pattern from a third look-up table 20. The third look-up table 20 stores the inter-row permutation patterns discussed above, and outputs one of the inter-row permutation patterns based on the block size K.

The product generated by the multiplier 18 is a generated interleaved address. A comparator 22 makes sure the resulting address is within the range of K, the block size, and outputs a valid address signal if the interleaved address is in the range of K. If the address is outside the range, the interleaver architecture must wait another cycle to provide the next valid address. During the comparison operation, the generated interleaved address is stored in a register 24 that is clocked by a clock of the turbo decoder.

Performing the MOD Operation with Decomposition

As will be appreciated, the components forming the architecture of FIG. 1 are straightforward, consisting of either memories, registers, or simple arithmetic units. Of these components, the mod computation device 12 tends to have the greatest complexity and non-deterministic computation time. A methodology of performing the mod operation according to the present invention that reduces complexity and computation time will now be described.

According to the methodology of the present invention, for a given block size K, the mod divisor p−1 is fixed. Given this pseudo-static value for p−1, the properties of mod can be taken advantage of to provide a much simpler solution. Consider equation (7) below which shows that the mod of a number can be broken down into a summation of mod operations onto the individual components that make up the number. In this case, equation (7), breaks up the dividend into its binary components and computes the mod of each power of two number. Each of the individual results are summed together, and then a final mod operation is performed.

$$\left[\sum_{i=0}^{x-1} y_i 2^i\right] \mod(p-1) = \left[\sum_{i=0}^{x-1} y_i [2^i \mod(p-1)]\right] \mod(p-1) \quad (7)$$

$$y_i \in \{0, 1\}$$

Figure 2:
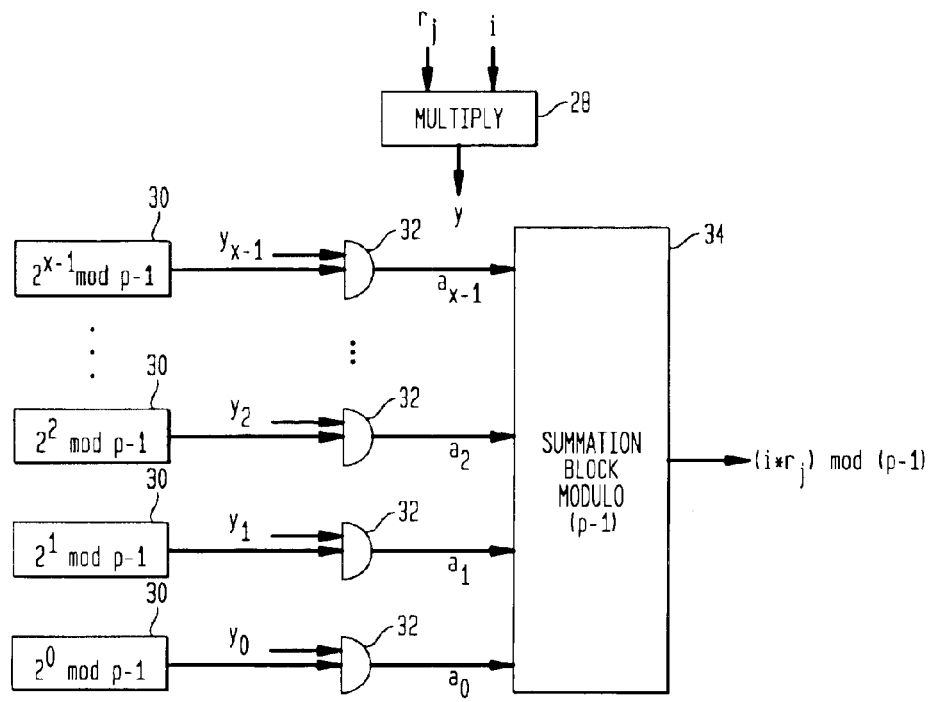
FIG. 2 shows an architecture for implementing the mod decomposition according to the present invention.

FIG. 2 shows an architecture for implementing the mod decomposition of equation (7). As shown, a multiplier 28 multiplies the column index and the inter-row sequence number to produce a binary product y. As further shown, the power of two mod calculations are pre-computed and stored into registers 30. These values are only changed when the block size changes, and only have to be downloaded at the beginning of the block. The binary product y represents the dividend of the mod operation. Each binary component (i.e., bit) is input along with a corresponding power of two mod value by an AND gate 32. For example, the least significant binary component y0 and the zeroth order power of two mod value are input by one of the AND gates 32, the next significant binary component y1 and the first order power of two mod value are input by the next AND gate 32, etc. The AND gates 32 logically AND the inputs to generate intermediate mod values $a_0, a_1, \ldots a_{x-1}$, which are passed to a modulo summation block 34.

Figure 3:
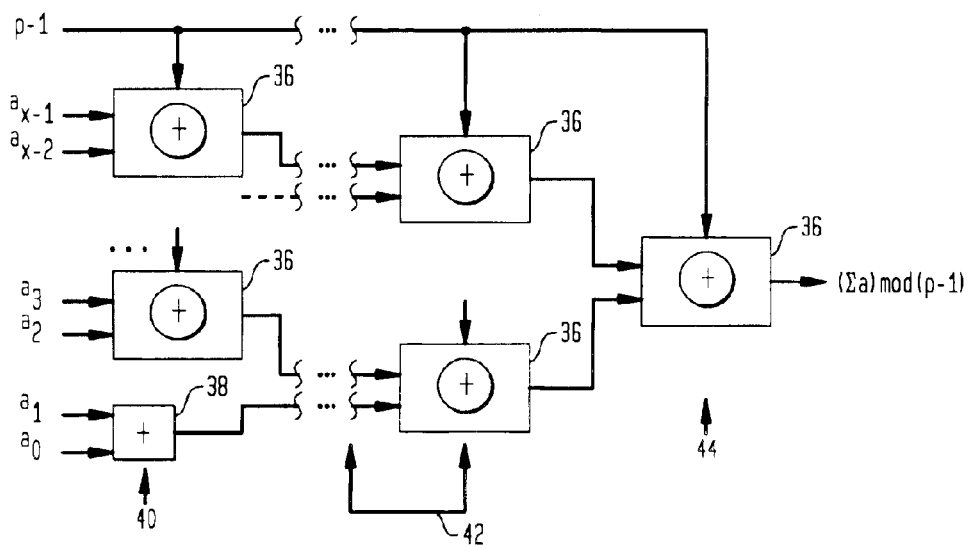
FIG. 3 illustrates the modulo summation block of FIG. 2 in greater detail.

FIG. 3 illustrates the modulo summation block 34 in greater detail. As shown, the modulo summation block 34 has a tree structure to minimize the propagation delay. Namely, the modulo summation block 34 has a base level 40, a number of intermediate levels 42 and a final level 44. Each level includes one or more modulo adders 36. Each modulo adder adds two input numbers together and generates the mod p−1 result of the sum. Accordingly, the base level 40 includes a modulo adder 36 for every two intermediate mod values a, the intermediate levels 42 include a modulo adder 36 for every two modulo adders 36 in the previous level, and the final level 44 includes a single modulo adder 36. As will be appreciated, the number of intermediate levels 42 is a number necessary to generate two outputs to the final level 44. When the modulo summation block 34 is used specifically with the 3GPP standard, the smallest possible value of p−1 is 6. Therefore, the first two intermediate mod values from FIG. 2 are at most 1 and 2 regardless of p−1 (i.e., 1 MOD 6=1, 2 MOD 6=2) so a simple adder 38 can be used in place of a modulo adder 36 because the value is guaranteed to be in modulo p−1 arithmetic. For the purposes of example only, this has been illustrated in FIG. 3.

Figure 4:
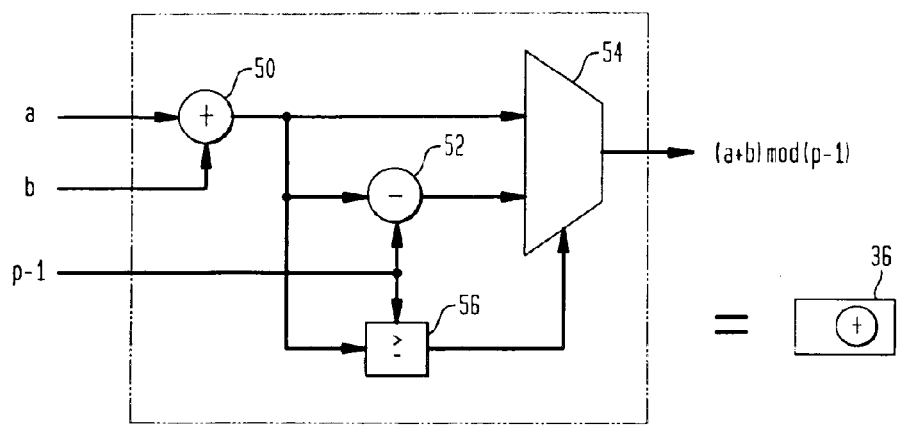
FIG. 4 illustrates an embodiment of a modulo adder in FIG. 2.

As discussed above, the modulo adders 36 perform two functions. First, they add the two input numbers together. Second, they check the sum and determines if the sum lies outside of the mod field. If so, the output value is wrapped around relative to the mod field. FIG. 4 illustrates an embodiment of a modulo adder 36. As shown, the modulo adder 36 includes an adder 50 adding inputs a and b, and a subtractor 52 subtracting the mod operand (e.g., p−1) from the sum of a+b. A selector 54 selectively outputs one of a+b and (a+b)−(p−1). A comparator 56 compares the value (p−1) to the sum a+b, and controls the selector 54 to output the sum a+b if the sum a+b is less than or equal to the value (p−1). Otherwise, the comparator 56 instructs the selector 54 to select the output of the subtractor 52.

Continuous Address Generation

Figure 5:
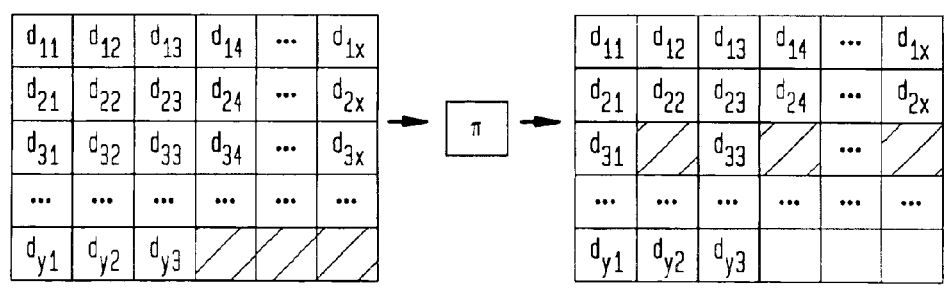
FIG. 5 shows a simple example of the interleaving process and how invalid addresses are generated.

A problem with interleaved address generators is that occasionally they generate addresses that are outside the valid range of the block size. When an address is generated outside of the range, the architecture produces a flag which identifies if the output is invalid, and then the architecture must wait another clock cycle before the next sequential interleaved address is valid. Over a large block size, this can create a large overhead in the turbo decoding process. FIG. 5 shows a simple example of the interleaving process and how invalid addresses are generated. Since the ranges of block sizes are continuous between 40 and 5114, the exact number of elements do not always fit exactly into the rectangular array defined by R and C. The values fill the array row by row, but the last row has some elements that are empty. In the process of interleaving, both the rows and columns are permutated based on the interleaving equations, and the empty cells are spread across a row. Thus when the interleaver starts to retrieve source addresses, occasionally it will generate an access to an empty cell.

With puncturing, the interleaver does not know that it has an invalid address until it has actually calculated the final address and compared the final address with the valid range of values. One solution is to make sure that the address generator is actually calculating both the current address and the next address at the same time. With both address available, the address interleaver first checks if the current generated address is valid. If the address is valid, the current address is used, but if the current address is not valid, the architecture can immediately substitute the next address. Because the interleaver proceeds in row-by-row basis, if the current address is invalid, the next address is guaranteed to be a valid address because all of the empty spaces come from the same row.

Figure 6:
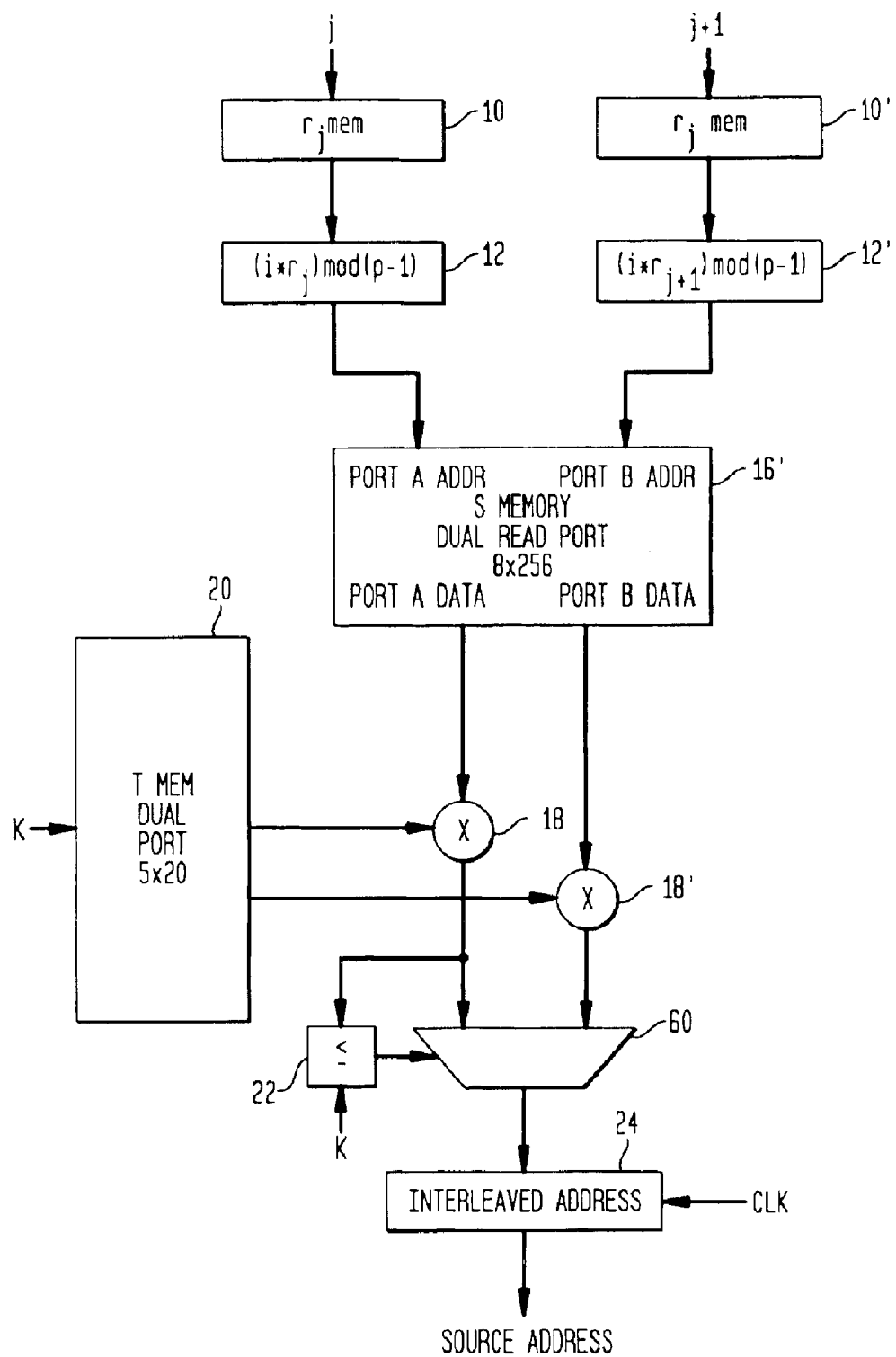
FIG. 6 shows the address interleaver architecture that generates both the current and next address at the same time.

FIG. 6 shows the address interleaver architecture that generates both the current and next address at the same time. In FIG. 6, selector 14 has been deleted for the sake of clarity. As shown, the first look-up table 10 generates the current inter-row sequence number using the current row index j as an address and a duplicate first look-up table 10' generates the next inter-row sequence number using the next row index j+1. The mod computation device 12 generates the current intra-row permutation address by computing $(i * r_j)$ mod (p−1). And, another mod computation device 12' generates the next intra-row permutation address by computing $(i * r_{j+1})$ mod (p−1). The mod computation devices 12 and 12' employ the methodology and architecture discussed above with respect to FIGS. 2 and 3.

A second look-up table 16' stores the intra-row permutation sequences S (see equation 4). The second look-up table 16' is a two input port, two output port memory, and outputs the current and next intra-row permutation sequences using the current and next intra-row permutation addresses, respectively. If a dual-port memory is not available a single memory can be used provided a double-rate clock is used to access the memory twice for every symbol required on the output. Multipliers 18 and 18' respectively receive the current and next intra-row permutation sequences from the second look-up table 16' and also receive an inter-row permutation pattern from the third look-up table 20.

The products generated by the multipliers 18 and 18' are current and next interleaved addresses, respectively. A multiplexer or selector 60 receives the current and next interleaved addresses, and selectively outputs one of the current and next interleaved addresses based on output from the comparator 22. The comparator 22 makes sure the current interleaved address is within the range of K, the block size, and outputs a valid address signal if the interleaved address is in the range of K. If valid, the output from the comparator 22 causes the multiplexer 60 to output the current interleaved address. If invalid, the output from the comparator 60 causes the multiplexer 60 to select the next interleaved address. Accordingly, processing time is reduced by not having to wait for the next valid interleaved address to be generated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method, comprising:
   generating an intra-row permutation address based on stored $2^i$ mod (p−1) values, for i=0 to x−1 an inter-row sequence number and a column index number, where p is a prime number dependent on a block size K of a data block being processed, x is greater than one, and the inter-row sequence number and the column index number correspond with the block size K and the prime number p.

2. The method of claim 1, wherein the generating step comprises:

selecting the stored $2^i$ mod (p−1) values based on the inter-row sequence number and the column index number; and
   combining the selected $2^i$ mod (p−1) values to generate the intra-row permutation address.

3. The method of claim 2, wherein the selecting step comprises:
   first multiplying the inter-row sequence number with the column index number to obtain a binary product; and
   second multiplying each binary component of the binary product with a respective one of the stored $2^i$ mod (p−1) values to obtain the selected $2^i$ mod (p−1) values.

4. The method of claim 1, further comprising:
   generating an interleaved address based on the intra-row permutation address.

5. The method of claim 4, wherein the generating an interleaved address step comprises:
   accessing an intra-row permutation sequence from a look-up table using the intra-row permutation address; and
   generating the interleaved address based on the intra-row permutation sequence and an inter-row permutation pattern.

6. The method of claim 1, wherein the generating step comprises:
   first multiplying the inter-row sequence number with the column index number to obtain a binary product;
   second multiplying each binary component of the binary product with a respective one of the stored $2^i$ mod (p−1) values to obtain a plurality of intermediate mod values; and
   determining the intra-row permutation address based on the plurality of intermediate mod values.

7. The method of claim 6, further comprising:
   generating an interleaved address based on the intra-row permutation address.

8. The method of claim 7, wherein the determining an intra-row permutation address step performs a mod summation operation on the plurality of intermediate mod values to generate the intra-row permutation address.

9. The method of claim 8, wherein the determining an intra-row permutation address step further comprises:
   summing adjacent intermediate mod values;
   generating mod (p−1) values of each sum to obtain a successive set of intermediate mod values; and
   repeating the summing and generating steps on each successive set of intermediate mod values until a single value is obtained, the single value being the intra-row permutation address.

10. The method of claim 8, further comprising:
    second performing the first multiplying, second multiplying, performing and generating steps for a current and subsequent inter-row sequence number to obtain first and second interleaved addresses, respectively;
    determining whether the first interleaved address is valid; and
    selecting one of the first and second interleaved addresses based on a result of the determining step.

11. The method of claim 6, wherein the second multiplying step ANDs each binary component with a respective one of the stored $2^i$ mod (p−1) values.

12. An apparatus, comprising:
    a mod operator storing each $2^i$ mod (p−1) value for i=0 to x−1, where p is a prime number dependent on a block size K of a data block being processed and x is greater than one, and generating an intra-row permutation address based on an inter-row sequence number, a column index number and the stored $2^i$ mod $(p-1)$ values.

13. The apparatus of claim 12, further comprising:

an interleaved address generator generating an interleaved address based on the intra-row permutation address.

14. The apparatus of claim 13, wherein the interleaved address generator comprises:

a look-up table storing intra-row permutation sequences, and outputting one of the intra-row permutation sequence based on the intra-row permutation address; and an address generator generating the interleaved address based on the intra-row permutation sequence and an inter-row permutation pattern.

15. The apparatus of claim 14, wherein the address generator multiplies the intra-row permutation sequence and an inter-row permutation pattern to obtain the interleaved address.

16. The apparatus of claim 13, further comprising:

a second mod operator generating a second intra-row permutation address based on a subsequent inter-row sequence number, the column index number and the stored $2^i$ mod $(p-1)$ values; and wherein the interleaved address generator generates first and second interleaved addresses based on the intra-row permutation address and the second intra permutation address, and selectively outputs one of the first and second interleaved addresses.

17. The apparatus of claim 12, wherein the mod operator comprises:

a memory storing the $2^i$ mod $(p-1)$ values;

a first multiplier multiplying the inter-row sequence number with the column index number to obtain a binary product, the inter-row sequence number and the column index number being for the block size K and the prime number p;

a second multiplier multiplying each binary component of the binary product with a respective one of the stored $2^i$ mod $(p-1)$ values to obtain a plurality of intermediate mod value; and a mod summation block performing a mod summation operation on the plurality of intermediate mod values to generate the intra-row permutation address.

18. The apparatus of claim 17, wherein the second multiplier comprises:

a plurality of AND gates, each AND gate ANDing one of the binary components with a respective one of the stored $2^i$ mod $(p-1)$ values.

19. The apparatus of claim 17, wherein the mod summation block comprises:

a tree lattice of modulo adders, each modulo adder in a base level of the tree lattice receiving adjacent intermediate mod values as inputs each modulo adder summing inputs to the modulo adder and generating mod $(p-1)$ values of the sum.

20. A modulo computation device, comprising:

a memory storing each $2^i$ mod $(p-1)$ values fort i=0 to x−1, where x is greater than one and p is a prime number; and a multiplier multiplying each binary component of an operand with a respective one of the stored $2^i$ mod $(p-1)$ values to obtain a plurality of intermediate mod values; and a mod summation block performing a mod summation operation on the plurality of intermediate mod values to generate a mod operation result.

21. The device of claim 20, wherein the multiplier comprises:

a plurality of AND gates, each AND gate ANDing one of the binary components with a respective one of the stored $2^i$ mod $(p-1)$ values.

22. The device of claim 20, wherein the mod summation block comprises:

a tree lattice of modulo adders, each modulo adder in a base level of the tree lattice receiving adjacent intermediate mod values as inputs, each modulo adder summing inputs to the modulo adder and generating mod p values of the sum.

* * * * *